United States Patent
Honma et al.

(10) Patent No.: US 10,731,255 B2
(45) Date of Patent: Aug. 4, 2020

(54) FILM FORMING METHOD

(71) Applicant: TOKYO ELECTRON LIMITED, Tokyo (JP)

(72) Inventors: Manabu Honma, Oshu (JP); Yuka Nakasato, Oshu (JP); Kohei Doi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 42 days.

(21) Appl. No.: 16/009,326

(22) Filed: Jun. 15, 2018

(65) Prior Publication Data

US 2018/0363134 A1 Dec. 20, 2018

(30) Foreign Application Priority Data

Jun. 19, 2017 (JP) .................................. 2017-119781

(51) Int. Cl.
*C23C 16/455* (2006.01)
*C23C 16/458* (2006.01)
(Continued)

(52) U.S. Cl.
CPC ........ *C23C 16/4584* (2013.01); *C23C 16/345* (2013.01); *C23C 16/45536* (2013.01);
(Continued)

(58) Field of Classification Search
CPC .......... C23C 16/45525; C23C 16/4584; C23C 16/45544; C23C 16/45551; C23C 16/45565; C23C 16/52
See application file for complete search history.

(56) References Cited

U.S. PATENT DOCUMENTS

2004/0182316 A1* 9/2004 Watanabe ........... C23C 16/4401
                                                        118/715
2006/0281337 A1* 12/2006 Matsuura .............. C23C 16/402
                                                        438/787
(Continued)

FOREIGN PATENT DOCUMENTS

JP      2013-168437 A    8/2013
WO   WO 2014/157827 A1 * 10/2014 ........... H01L 21/205

OTHER PUBLICATIONS

Poodt, P., et al., "Spatial atomic layer deposition: a route towards further industrialization of atomic layer deposition". Journal of Vacuum Science and Technology A: Vacuum, Surfaces, and Films, 30(1), 010802, 2012, pp. 1-11. https://doi.org/10.1116/1.3670745.*
(Continued)

*Primary Examiner* — Bret P Chen
(74) *Attorney, Agent, or Firm* — Nath, Goldberg & Meyer; Jerald L. Meyer

(57) ABSTRACT

A film forming method comprises loading a substrate on a rotary table, forming an adsorption region for adsorbing a raw material gas to the substrate by discharging the raw material gas from multiple discharge ports, forming a reaction region, to which a reaction gas is supplied, at a position spaced from the adsorption region, separating an atmosphere of the adsorption region and an atmosphere of the reaction region by exhausting and by supplying a purge gas, forming a film by performing a cycle a plurality of times to deposit the reaction product on the substrate, the cycle comprising passing the substrate through the adsorption region and the reaction region and setting a combination of flow rates of the raw material gas for a first pattern in order to perform the cycle with the first pattern and for a second pattern in order to perform the cycle with the second pattern.

6 Claims, 12 Drawing Sheets

(51) Int. Cl.
*C23C 16/52* (2006.01)
*C23C 16/511* (2006.01)
*C23C 16/34* (2006.01)

(52) U.S. Cl.
CPC .. *C23C 16/45544* (2013.01); *C23C 16/45551* (2013.01); *C23C 16/45565* (2013.01); *C23C 16/511* (2013.01); *C23C 16/52* (2013.01)

(56) References Cited

U.S. PATENT DOCUMENTS

| | | | | |
|---|---|---|---|---|
| 2010/0310771 | A1* | 12/2010 | Lee | C23C 16/32 427/255.28 |
| 2011/0236598 | A1* | 9/2011 | Kumagai | C23C 16/45536 427/569 |
| 2012/0108077 | A1* | 5/2012 | Kaga | C23C 16/34 438/771 |
| 2013/0189854 | A1* | 7/2013 | Hausmann | H01L 21/0217 438/792 |
| 2014/0120723 | A1* | 5/2014 | Fu | C23C 16/42 438/680 |
| 2015/0361553 | A1* | 12/2015 | Murakawa | C23C 16/4412 156/345.55 |
| 2016/0099144 | A1* | 4/2016 | Saly | C23C 16/402 438/787 |
| 2016/0237563 | A1* | 8/2016 | Sieber | C23C 16/4584 |
| 2016/0293390 | A1* | 10/2016 | Miura | H01J 37/32972 |
| 2017/0067160 | A1* | 3/2017 | Kato | C23C 16/4584 |
| 2017/0125258 | A1* | 5/2017 | Sato | H01J 37/32513 |

OTHER PUBLICATIONS

Johnson, Richard W., et al., "A brief review of atomic layer deposition: from fundamentals to applications". Materials Today, vol. 17, No. 5, Jun. 2014, pp. 236-246.*

Poodt, Paul, et al., "High-Speed Spatial Atomic-Layer Deposition of Aluminum Oxide Layers for Solar Cell Passivation". Adv. Mater. 2010, 22, 3564-3567. DOI: 10.1002/adma.201000766.*

Maydannik, P.S., et al., "An atomic layer deposition process for moving flexible substrates". Chemical Engineering Journal, 171 (2011) 345-349. doi:10.1016/j.cej.2011.03.*

Sharma, Kashish, et al., "Spatial atomic layer deposition on flexible substrates using a modular rotating cylinder reactor". Journal of Vacuum Science & Technology A 33(1), Jan./Feb. 2015, 01A132, pp. 1-8. doi: 10.1116/1.4902086.*

Sharma, Kashish, et al., "Spatial atomic layer deposition on flexible porous substrates: ZnO on anodic aluminum oxide films and Al2O3 on Li ion battery electrodes". Journal of Vacuum Science & Technology A 34(1), Jan./Feb. 2016, 01A146, pp. 1-10. http://dx.doi.org/10.1116/1.4937728.*

* cited by examiner

FILM FORMING METHOD

CROSS-REFERENCE TO RELATED APPLICATION

This application is based upon and claims the benefit of priority from Japanese Patent Application No. 2017-119781, filed on Jun. 19, 2017, the entire contents of which are incorporated herein by reference.

TECHNICAL FIELD

The present disclosure relates to a technique of performing a film forming process by rotating a substrate loaded on a rotary table.

BACKGROUND

In a manufacturing process of a semiconductor device, film formation is often carried out on a semiconductor wafer (hereinafter, referred to as a "wafer") as a substrate by atomic layer deposition (ALD). A film forming apparatus that performs the ALD, may be configured such that a wafer is loaded on a rotary table installed in a vacuum container, and the wafer that rotates by rotation of the rotary table repeatedly passes through an atmosphere where a raw material gas is supplied and an atmosphere where a reaction gas that reacts with the raw material gas is supplied, thereby performing film formation.

In the film forming apparatus, for example, a shower head is installed to face the rotary table, and the raw material gas is discharged from a discharge port of the shower head to form the atmosphere of the raw material gas. In order to separate the atmosphere of the raw material gas from the atmosphere of the reaction gas, for example, in the shower head described above, an exhaust port and a discharge port of a purge gas are installed so as to surround the discharge port of the raw material gas such that the exhaust and the discharge of the purge gas are performed. The film forming apparatus having such a shower head is known in the art.

When a film is formed using the film forming apparatus having the shower head, a film thickness of an end portion on the central side of the rotary table and a film thickness of an end portion on the circumferential end side of the rotary table may become smaller than a film thickness of other portions, with respect to a film thickness in the plane of the wafer when the rotary table is viewed in a radial direction. It is considered that this is based on the fact that a relatively large amount of the raw material gas supplied to each of these end portions is exhausted without being adsorbed to the wafer because the exhaust from the exhaust port is performed near the end portion on the central side and the end portion on the peripheral edge side of the rotary table in the plane of the wafer, when the wafer is moved to a position facing the shower head by rotation of the rotary table.

SUMMARY

Some embodiments of the present disclosure provide a technique capable of improving uniformity of a film thickness in a plane of a substrate, in forming a film by repeatedly passing through a region to which a raw material gas is supplied and a region to which a reaction gas is supplied by rotating the substrate.

According to one embodiment of the present disclosure, a film forming method comprises: loading a substrate on a rotary table installed in a vacuum container to rotate the substrate, forming an adsorption region for adsorbing a raw material gas to the substrate along a radial direction of the rotary table by discharging the raw material gas to different positions in the radial direction of the rotary table, respectively, from multiple discharge ports formed in an opposing part that is installed to face the rotary table, forming a reaction region, to which a reaction gas that reacts with the raw material gas to generate a reaction product is supplied, at a position spaced from the adsorption region in a rotational direction of the rotary table, separating an atmosphere of the adsorption region and an atmosphere of the reaction region by exhausting along a periphery of the adsorption region and by supplying a purge gas along the periphery of the adsorption region, forming a film by performing a cycle a plurality of times to deposit the reaction product on the substrate, the cycle comprising passing the substrate through the adsorption region and then the reaction region and setting a combination of flow rates of the raw material gas, which are discharged from the multiple discharge ports, respectively, for a first pattern in order to perform the cycle with the first pattern and for a second pattern in order to perform the cycle with the second pattern, the second pattern being different from the first pattern.

According to one embodiment of the present disclosure, a film forming apparatus, comprises: a rotary table installed in a vacuum container and configured to load a substrate to cause the substrate to rotate, an opposing part that faces the rotary table, multiple discharge ports installed in the opposing part and configured to form an adsorption region for adsorbing a raw material gas onto the substrate along a radial direction of the rotary table by discharging the raw material gas to different positions in the radial direction of the rotary table, respectively, a reaction gas supply part configured to form a reaction region, to which a reaction gas that reacts with the raw material gas to generate a reaction product is supplied, at a position spaced from the adsorption region in a rotational direction of the rotary table, an exhaust port and a purge gas discharge port, each of which is installed in the opposing part, to separate an atmosphere of the adsorption region and an atmosphere of the reaction region, the exhaust port being configured to perform exhausting along a periphery of the adsorption region and the purge gas discharge port being configured to supply a purge gas along the periphery of the adsorption region; and a controller configured to output a control signal to execute, in forming a film by performing a cycle a plurality of times to deposit the reaction product on the substrate, the cycle comprising passing the substrate through the adsorption region and then the reaction region, and performing a step of setting a combination of flow rates of the raw material gas, which are discharged from the multiple discharge ports, respectively, for a first pattern in order to perform the cycle with the first pattern and of setting the combination for a second pattern in order to perform the cycle with the second pattern, the second pattern being different from the first pattern.

According to one embodiment of the present disclosure, a non-transitory computer-readable storage medium storing a computer program used in a film forming apparatus for forming a film on a substrate loaded on a rotary table, wherein the computer program has steps organized to execute the film forming method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
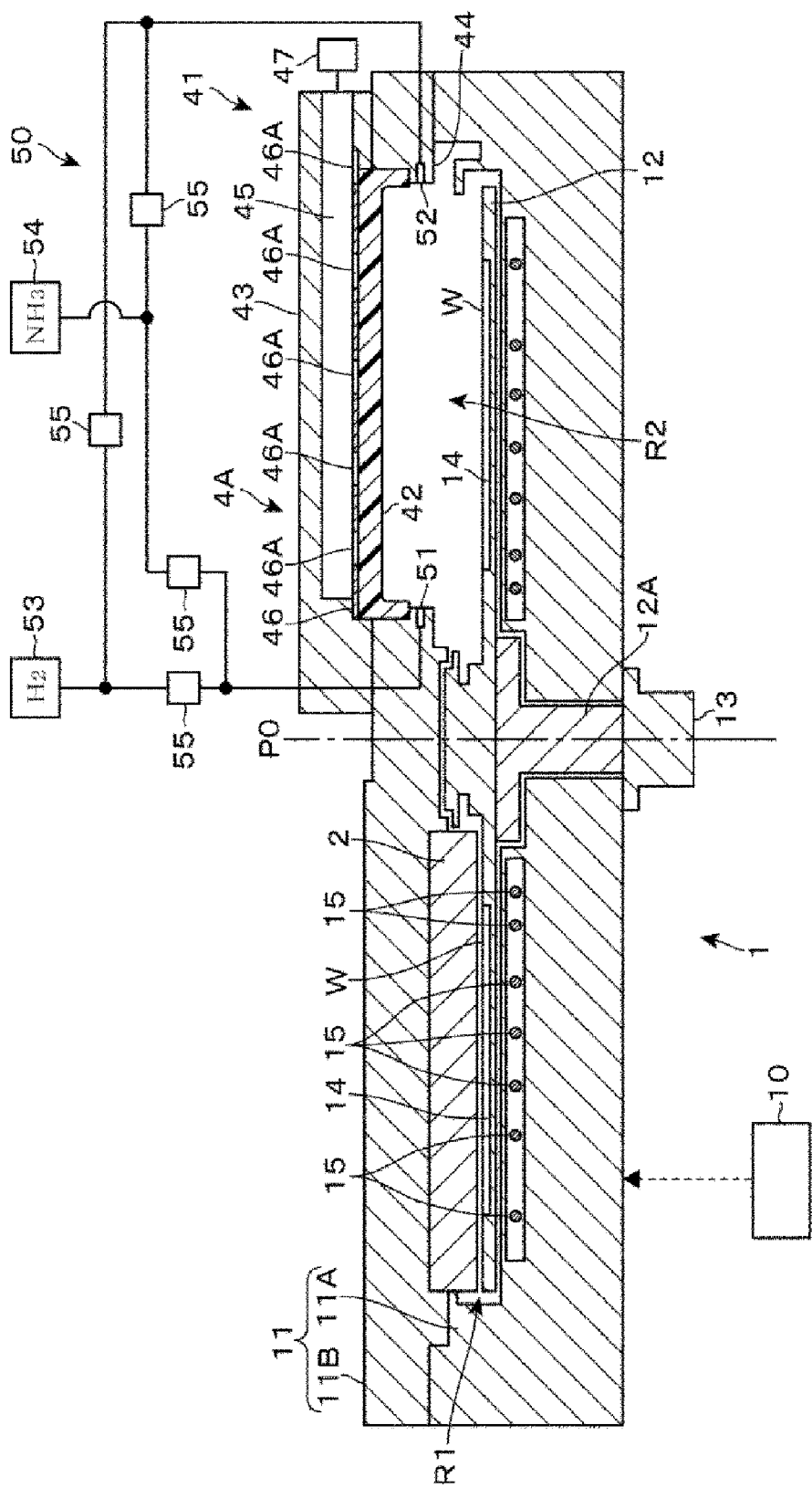
FIG. 1 is a longitudinal sectional side view of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 which is one embodiment of the present disclosure will be described with reference to FIG. 1 which is a longitudinal sectional side view and FIG. 2 which is a transverse sectional plan view. The film forming apparatus 1 is configured to form an atmosphere of a raw material gas and an atmosphere of a reaction gas on a rotary table, which will be described later, at positions spaced from each other in a rotational direction of the rotary table, respectively, and to alternately and repeatedly pass through the atmosphere of the raw material gas and the atmosphere of the reaction gas by rotating a wafer W loaded on the rotary table by rotation of the rotary table. By repeatedly passing through each atmosphere in this manner, ALD is performed on the wafer W to form a silicon nitride (SiN) film. The wafer W is circular, and is a substrate having a diameter of, for example, 300 mm.

In the drawing, reference numeral 11 denotes a flat, substantially circular vacuum container (process container), which is configured by a container body 11A constituted by a sidewall and a bottom portion, and a ceiling plate 11B. In the drawing, reference numeral 12 denotes the rotary table, which has a circular shape and is horizontally installed in the vacuum container 11. In the drawing, reference numeral 12A denotes a support part that supports the central part of a rear surface of the rotary table 12. In the drawing, reference numeral 13 denotes a rotation mechanism, which rotates the rotary table 12 in its circumferential direction, for example, clockwise when viewed from above, via the support part 12A. In the drawing, reference symbol P0 denotes a rotary shaft that passes through the center of the rotary table 12.

Six circular recesses 14 are installed on an upper surface of the rotary table 12 along the circumferential direction (rotational direction) of the rotary table 12, and wafers W are received in the recesses 14, respectively. And, each wafer W is loaded on the rotary table 12 so as to rotate by the rotation of the rotary table 12. Further, during a film forming process, the wafers W are loaded in all the recesses 14, but FIG. 2 illustrates a state in which the wafer W is loaded only in one recess 14.

In FIG. 1, reference numeral 15 denotes a heater, in which a plurality of heaters is installed concentrically at the bottom of the vacuum container 11 and heats the wafers W loaded on the rotary table 12. In FIG. 2, reference numeral 16 denotes a transfer port of the wafer W which is opened to the sidewall of the vacuum container 11, and reference numeral 17 denotes a gate valve for opening and closing the transfer port 16. By a substrate transfer mechanism (not shown), the wafer W is delivered between the outside of the vacuum container 11 and the inside of the recess 14 via the transfer port 16.

The gas shower head 2, a plasma forming unit 4A, a plasma forming unit 4B, and a plasma forming unit 4C are installed on the rotary table 12 sequentially toward the upstream side in the rotational direction of the rotary table 12 along the rotational direction. The gas shower head 2, which is an opposing part facing the rotary table 12, will be described with reference to FIG. 3 which is a longitudinal sectional side view and FIG. 4 which is a bottom view. The gas shower head 2 has a fan shape which widens in the circumferential direction of the rotary table 12 from the central side of the rotary table 12 toward the peripheral side of the rotary table 12 when viewed from a plane view. The lower surface of the gas shower head 2 forms a horizontally opposed surface formed so as to be close to the upper surface of the rotary table 12.

A gas discharge port 21, an exhaust port 22 and a purge gas discharge port 23 are respectively opened vertically downward on the lower surface of the gas shower head 2. A multiple gas discharge ports 21 are arranged to be dispersed in a discharge port forming region 24 inside the peripheral edge portion of the lower surface of the gas shower head 2. The discharge port forming region 24 is configured to have a fan shape which widens in the circumferential direction of the rotary table 12 from the central side of the rotary table 12 toward the peripheral side thereof. During the rotation of the rotary table 12, the gas discharge port 21 discharges a dichlorosilane (DCS) gas, which is a raw material gas containing silicon (Si) for forming an SiN film, downward in a shower shape.

The discharge port forming region 24 is configured by three sections 24A, 24B, and 24C each including multiple gas discharge ports 21. The gas shower head 2 is configured such that the DCS gas can be independently supplied to a gas discharge port 21 of the section 24A forming a first discharge port, a gas discharge port 21 of the section 24B forming a second discharge port, and a gas discharge port 21 of the section 24C forming a third discharge port. The sections 24A, 24B, and 24C are located sequentially from the central side of the rotary table 12 toward the peripheral side thereof along the radial direction of the rotary table 12. For example, the sections 24A and 24C have a circular arc-shaped layout along the rotational direction of the rotary table 12, and the section 24B has a fan-shaped layout.

Figure 3:
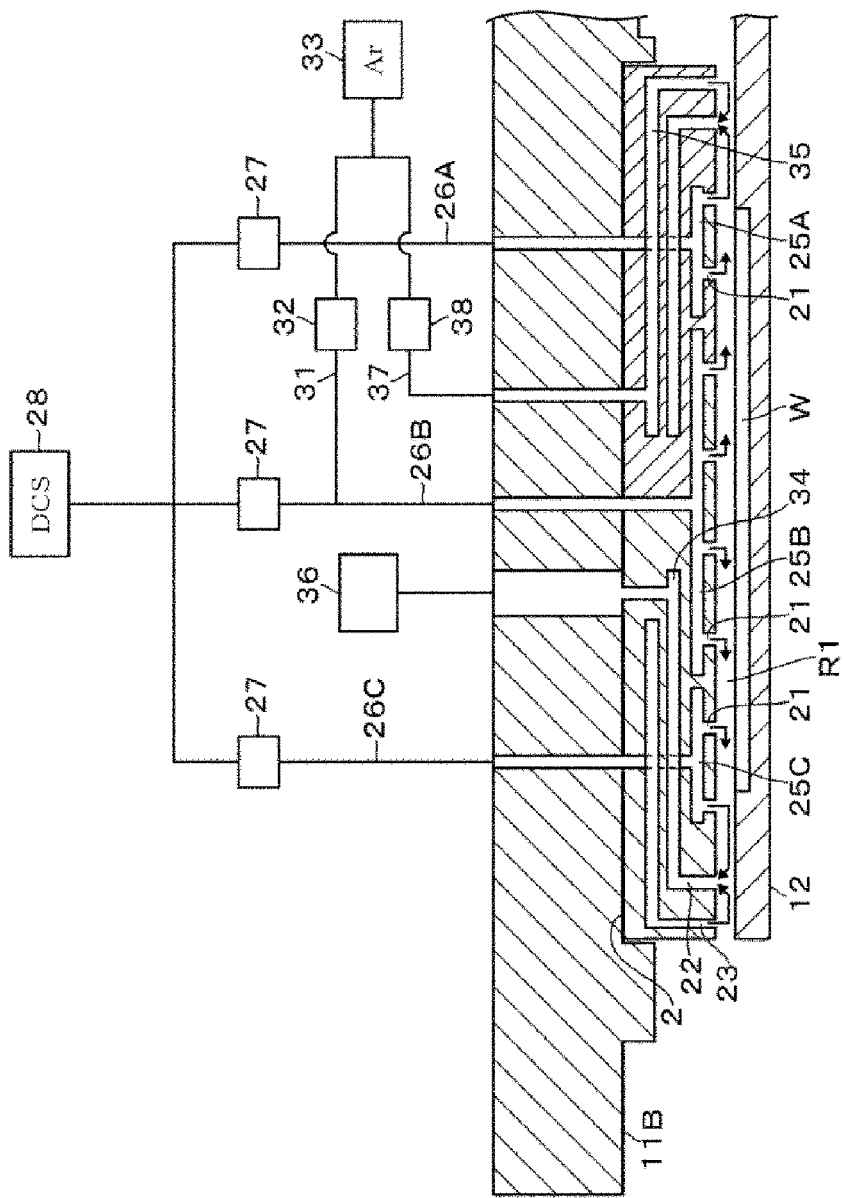
FIG. 3 is a longitudinal sectional side view of a gas shower head installed in the film forming apparatus.

In FIG. 3, reference numerals 25A, 25B and 25C denote gas flow paths formed so as to be partitioned from each other in the gas shower head 2, and the downstream ends of the gas flow paths 25A, 25B, and 25C are respectively formed as the gas discharge port 21 of the section 24A, the gas discharge port 21 of the section 24B, and the gas discharge port 21 of the section 24C. Downstream ends of pipes 26A, 26B, and 26C are respectively connected to the upstream sides of the gas flow paths 25A, 25B, and 25C, and gas supply devices 27 are respectively interposed in these pipes 26A, 26B, and 26C. Furthermore, the pipes 26A, 26B, and 26C join at the upstream sides of the respective gas supply devices 27, which are connected to a DCS gas supply source 28.

The gas supply device 27 is configured by a valve and a mass flow controller and controls the flow rate of the DCS gas supplied from the supply source 26 to each of the gas flow paths 25A, 25B, and 25C. Each gas supply device other than the gas supply devices 27, which will be described later, is configured similarly to the gas supply devices 27 and controls the flow rate of a gas to be supplied to the corresponding downstream side. Controlling the flow rate in this manner also includes setting the flow rate of the gas to 0, namely stopping the supply of the gas to the downstream side.

Since the gas shower head 2 is configured as described above, if the lower sides of the section 24A, the section 24B, and the section 24C on the rotary table 12 are respectively assumed as a first position, a second position, and a third position, the DCS gas can be independently supplied to the first position to the third position. That is, the DCS gas can be independently supplied to different positions in the longitudinal direction of the region extending along the radial direction of the rotary table 12. When the wafer W is located below the gas shower head 2, an end portion on the central side of the rotary table 12 of the wafer W is located at the first position, the central part of the wafer W is located at the second position and an end portion on the peripheral side of the rotary table 12 of the wafer W is located at the third position, when viewed in the radial direction of the rotary table 12. Since the sections 24A to 24C are set as such, when the DCS gas is being discharged from each of the gas discharge ports 21 of the sections 24A to 24C, the DCS gas is supplied to the entire surface of the rotating wafer W.

Figure 4:
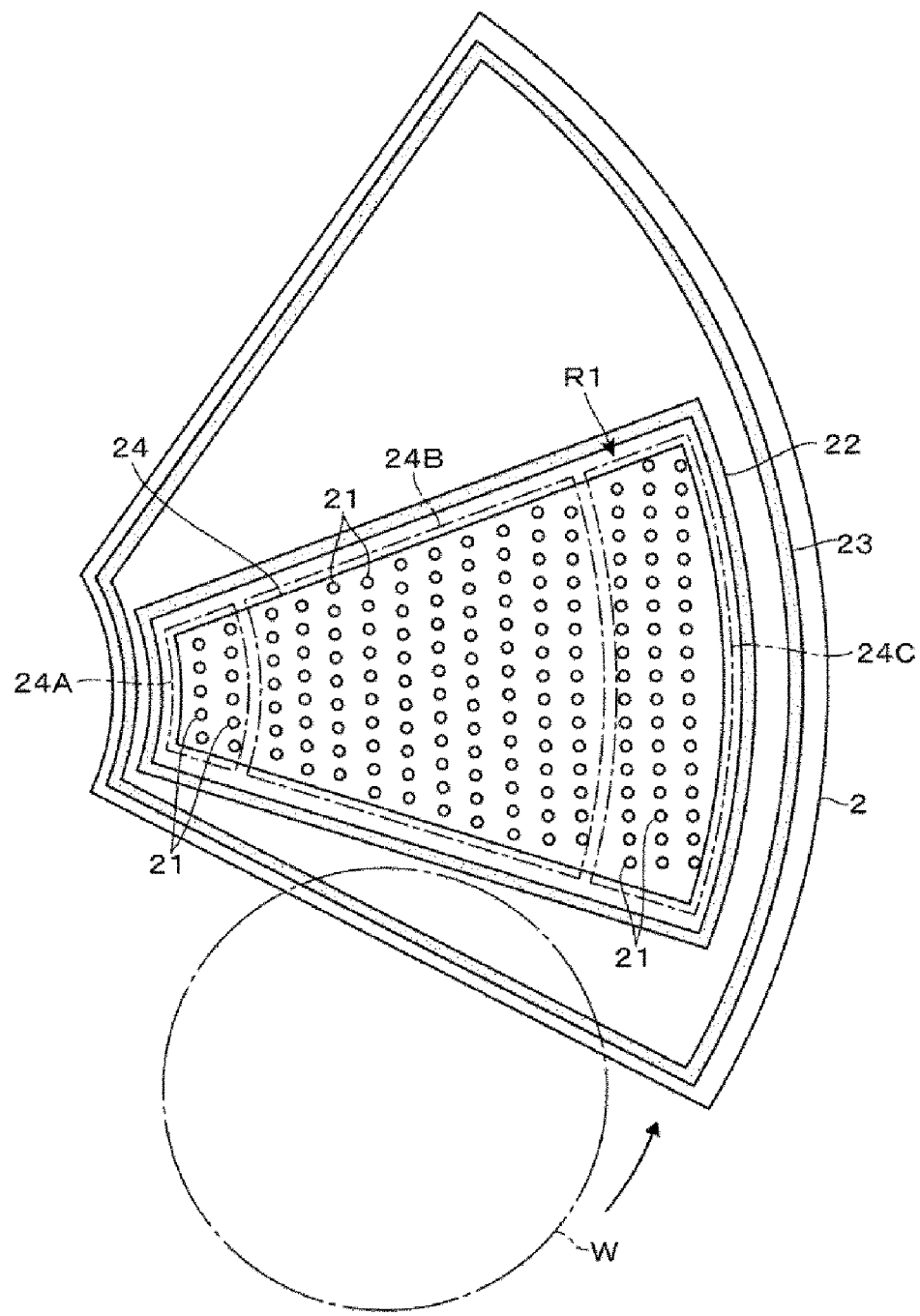
FIG. 4 is a bottom view of the gas shower head.

Furthermore, as illustrated in FIG. 4, the downstream end of the pipe 31 is connected to the downstream side of the gas supply device 27 in the pipe 26B, and the upstream end of the pipe 31 is connected to an argon (Ar) gas supply source 33 via a gas supply device 32. Thus, the DCS gas and/or an Ar gas can be discharged from the gas discharge port 21 of the section 24B and supplied to the second position.

Next, each of the exhaust port 22 and the purge gas discharge port 23 will be described. In FIG. 4, in order to facilitate identification, multiple dots are given to the exhaust port 22 and the purge gas discharge port 23 for illustration. The exhaust port 22 is annularly opened outside the discharge port forming region 24 along the outer periphery of the discharge port forming region 24. The purge gas discharge port 23 is annularly opened along the peripheral edge portion of the lower surface of the gas shower head 2 so as to surround the exhaust port 22 and the discharge port forming region 24.

In FIG. 3, reference numerals 34 and 35 denote gas flow paths which are installed in the gas shower head 2 and partitioned from each other, and which are also formed to be partitioned from the gas flow paths 25A to 25C of the raw material gas. The upstream end of the gas flow path 34 is configured as the exhaust port 22, and the downstream end of the gas flow path 35 is configured as the purge gas discharge port 23. The downstream end of the gas flow path 34 is connected to an exhaust mechanism 36 to perform the exhaust from the exhaust port 22 by the exhaust mechanism 36. The downstream end of a pipe 37 is connected to the upstream end of the gas flow path 35 and the upstream end of the pipe 37 is connected to the upstream side of the gas supply device 32 of the pipe 31 via a gas supply device 38. Thus, the Ar gas is supplied as a purge gas from the gas supply source 33 to the purge gas discharge port 23.

During the film forming process, the discharge of the DCS gas from the gas discharge port 21, the exhaust from the exhaust port 22, and the discharge of the purge gas from the purge gas discharge port 23 are all performed. The discharged DCS gas and purge gas diffuse on the upper surface of the rotary table 12 and are exhausted from the exhaust port 22. The arrows in FIG. 3 indicate the flows of the DCS gas and the purge gas. As the purge gas flows toward the exhaust port 22, the DCS gas is prevented from flowing outside of a region surrounded by the exhaust port 22 when viewed from a plane view. That is, an atmosphere where the DCS gas is supplied is limitedly formed in the region surrounded by the exhaust port 22 between the gas shower head 2 and the rotary table 12, and the DCS gas is adsorbed onto the wafer W. If the region surrounded by the exhaust port 22 is assumed as an adsorption region R1 of the DCS gas, the exhaust port 22 performs the exhaust along the periphery of the adsorption region R1. In addition, since the purge gas discharged from the purge gas discharge port 23 flows below the exhaust port 22 as described above, the purge gas is supplied along the periphery of the adsorption region R1.

Subsequently, the plasma forming units 4A to 4C will be described. The plasma forming units 4A to 4C are configured in the same manner, and the plasma forming unit 4A representatively illustrated in FIG. 1 will be described here. The plasma forming unit 4A supplies a plasma-forming gas onto the rotary table 12, and also supplies a microwave to the plasma-forming gas to generate plasma on the rotary table 12. The plasma forming unit 4A includes an antenna 41 for supplying the microwave, in which the antenna 41 includes a dielectric plate 42 and a waveguide 43 made of metal.

The dielectric plate 42 has a substantially fan shape which widens from the central side of the rotary table 12 toward the peripheral side thereof when viewed from a plane view. A substantially fan-shaped through hole is formed in the ceiling plate 11B of the vacuum container 11 so as to correspond to the shape of the dielectric plate 42. An inner peripheral surface of the lower end of the through hole slightly protrudes toward the central side of the through hole so as to form a support part 44. The dielectric plate 42 closes the through hole from the upper side and is installed so as to face the rotary table 12, and the peripheral edge portion of the dielectric plate 42 is supported by the support part 44.

The waveguide 43 is installed on the dielectric plate 42 and has an interior space 45 extending along the radial direction of the rotary table 12. In the drawing, reference numeral 46 denotes a slot plate constituting the lower side of the waveguide 43, which is installed so as to make contact with the dielectric plate 42 and has a plurality of slot holes 46A. An end portion of the waveguide 43 on the central side of the rotary table 12 is closed, and a microwave generator 47 is connected to an end portion on the peripheral edge side of the rotary table 12. The microwave generator 47 supplies a microwave of, for example, about 2.45 GHz, to the waveguide 43.

In addition, the plasma forming unit 4A includes a first gas discharge port 51 and a second gas discharge port 52 each of which supplies a plasma-forming gas to the lower surface side of the dielectric plate 42. These gas discharge ports 51 and 52 are plurally installed on the support part 44 of the dielectric plate 42, for example, along the circumferential direction of the vacuum container 11. The first gas discharge port 51 discharges the plasma-forming gas from the central side of the rotary table 12 toward the peripheral side thereof, the second gas discharge port 52 discharges the plasma-forming gas from the peripheral side of the rotary table 12 toward the central side thereof, respectively.

The microwave supplied to the waveguide 43 passes through the slot hole 46A of the slot plate 46 and reaches the dielectric plate 42, and is supplied to the plasma-forming gas discharged below the dielectric plate 42 to limitedly form plasma in a plasma forming region R2 which is the lower region of the dielectric plate 42. In addition, the plasma forming regions of the plasma forming units 4B and 4C are respectively represented by R3 and R4, and similar to the plasma forming region R2, plasma is also formed in these plasma forming regions R3 and R4.

As the plasma-forming gas, it may be possible to use, for example, a hydrogen ($H_2$) gas or an ammonia ($NH_3$) gas. In the drawing, reference numeral 53 denotes an $H_2$ gas supply source and reference numeral 54 denotes an $NH_3$ gas supply source. The first gas discharge port 51 and the second gas discharge port 52 are respectively connected to the $H_2$ gas supply source 53 and the $NH_3$ gas supply source 54 via a pipe system 50 having a gas supply device 55. This pipe system 50 is configured to control the flow rate of the $H_2$ gas from the gas supply source 53 to each of the gas discharge ports 51 and 52, and to control the flow rate of the $NH_3$ gas from the gas supply source 54 to each of the gas discharge ports 51 and 52.

The $NH_3$ gas is a reaction gas for nitriding the DCS gas adsorbed onto the wafer W. The plasma forming regions R2 to R4 form reaction regions where the nitriding is performed by plasma of the $NH_3$ gas. As described above, the atmospheres in the plasma forming regions R2 to R4, which are the reaction regions, and the atmosphere in the adsorption region R1 are separated from each other by the discharge and the exhaust of the purge gas in the gas shower head 2. Furthermore, since the supply and the exhaust of the purge gas performed in the gas shower head 2 are not performed in the plasma forming units 4A to 4C, the respective atmospheres in the plasma forming regions R2 to R4 are not separated from each other.

Figure 2:
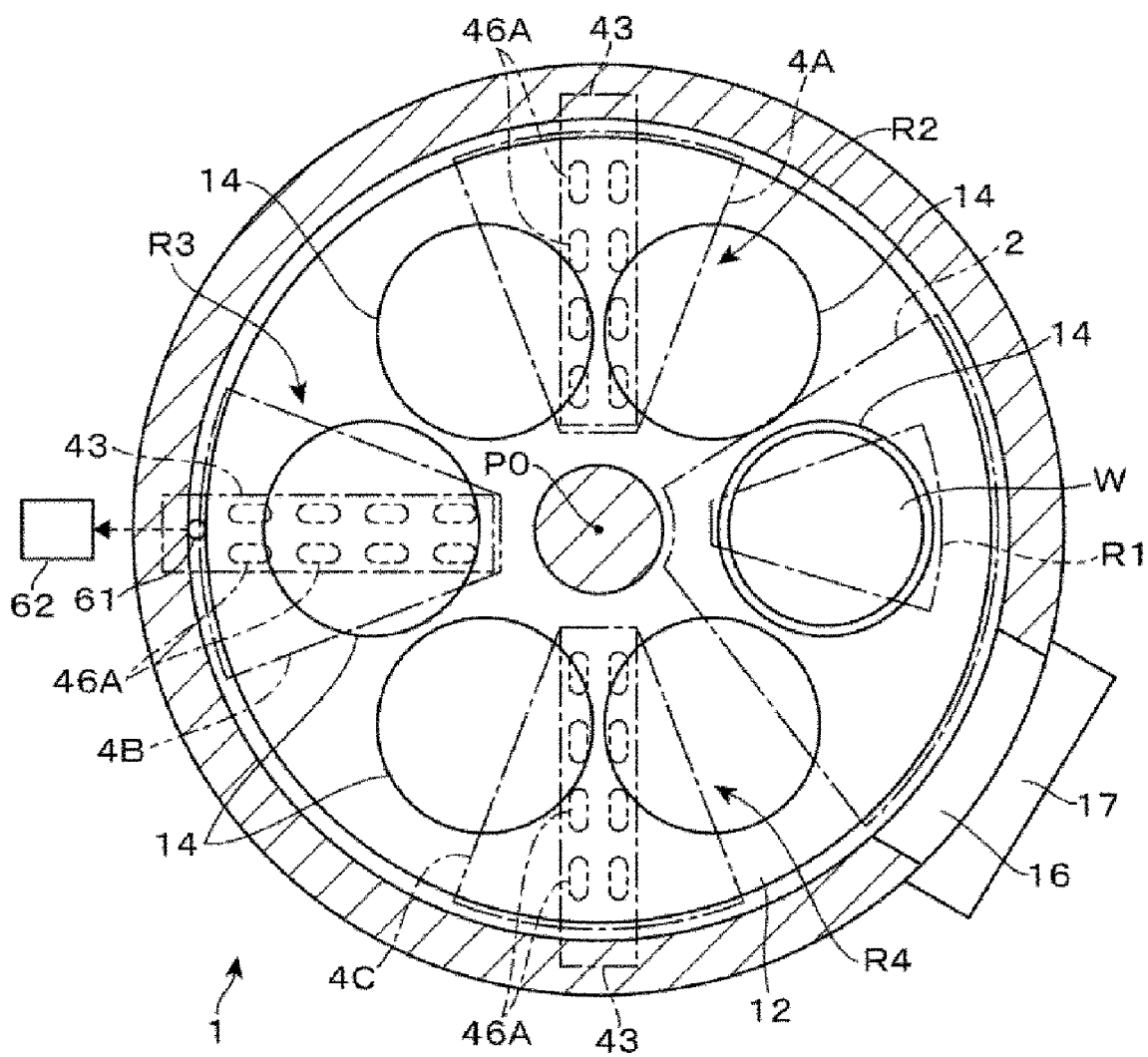
FIG. 2 is a transverse sectional plan view of the film forming apparatus.

In addition, as illustrated in FIG. 2, an exhaust port 61 is opened at the bottom of the vacuum container 11 below the outside of the rotary table 12, and an exhaust mechanism 62 is connected to the exhaust port 61. The amount of exhaust from the exhaust port 61 by the exhaust mechanism 62 is adjustable, and a vacuum atmosphere having a pressure corresponding to the exhaust amount is formed in the vacuum container 11. Each gas discharged from the plasma forming units 4A to 4C is exhausted from the exhaust port 61 and removed.

As illustrated in FIG. 1, a controller 10 configured as a computer is installed in the film forming apparatus 1, and a program is stored in the controller 10. This program has a group of steps organized to cause a control signal to transmit to each part of the film forming apparatus 1 to control the operation of each part so as to perform the film forming process as described hereinbelow. Specifically, the number of rotations of the rotary table 12 by the rotation mechanism 13, the flow rate of each gas supplied to the downstream sides of the pipes by each gas supply device, the exhaust amount by each of the exhaust mechanisms 36 and 62, the supply and termination of microwaves from the microwave generator 47 to the antenna 41, the power supply to the heater 15, and the like are controlled by the program. The control of the power supply to the heater 15 is, for example, the control of the temperature of the wafer W, and the control of the exhaust amount by the exhaust mechanism 62 is, for example, the control of internal pressure of the vacuum container 11. This program is installed in the controller 10 from a non-transitory computer-readable storage medium, such as a hard disk, a compact disc, a DVD, a memory card or the like.

Figure 5:
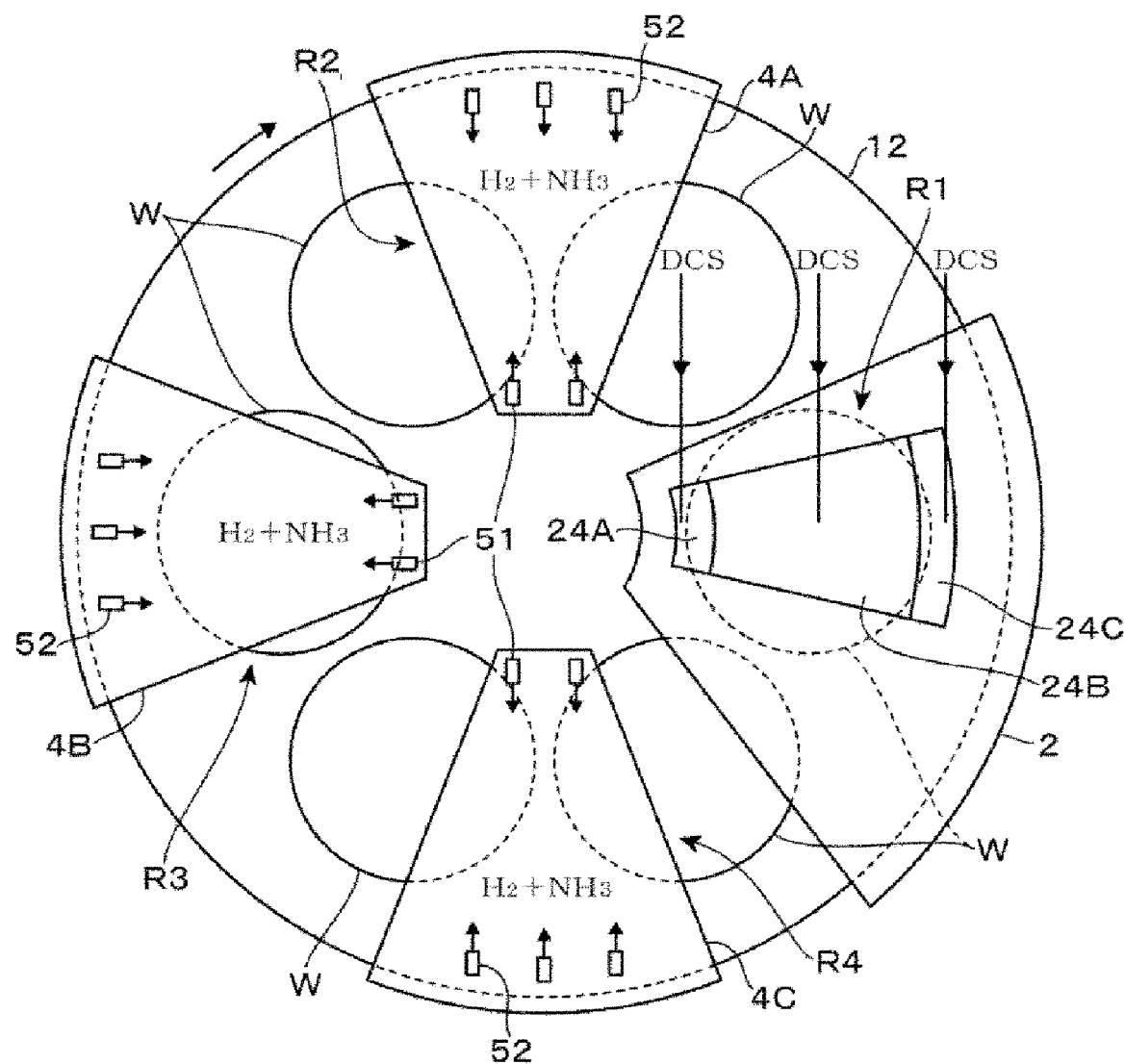
FIG. 5 is a plan view illustrating a gas supply state in the film forming apparatus.

Hereinafter, the film forming process performed by the film forming apparatus 1 will be described with reference to FIGS. 5 and 6 which are plan views of the rotary table 12 showing the types of gases to be supplied to the respective parts in the vacuum container 11. First, when six wafers W are transferred into the vacuum container 11 by the substrate transfer mechanism and loaded in the recesses 14 of the rotary table 12 respectively, the gate valve 17 installed at the transfer port 16 is closed, and the interior of the vacuum container 11 is hermetically sealed. The wafers W are heated by the heater 15 so as to have a predetermined temperature, and the interior of the vacuum container 11 becomes a vacuum atmosphere of a predetermined pressure by the exhaust from the exhaust port 61 and the rotary table 12 rotates by a predetermined number of rotations.

Furthermore, in the plasma forming units 4A to 4C, a mixture gas of the $H_2$ gas and the $NH_3$ gas is discharged at a predetermined flow rate from each of the first gas discharge port 51 and the second gas discharge port 52, and a microwave is supplied from the microwave generator 47. By the microwave, plasma is formed by the $H_2$ gas and the $NH_3$ gas in each of the plasma forming regions R2 to R4. While the plasma is formed in this manner, in the gas shower head 2, the discharge of the DCS gas from the gas discharge ports 21 in the sections 24A to 24C, the discharge of the purge gas from the purge gas discharge port 23, and the exhaust from the exhaust port 22 are performed to form a DCS gas atmosphere in the adsorption region R1 on the rotary table 12. FIG. 5 illustrates a state in which the formation of plasma and the formation of the DCS gas atmosphere are performed in this manner.

The DCS gas is adsorbed onto the surface of the wafer W when the wafer W passes through the adsorption region R1 by the rotation of the rotary table 12. Subsequently, when the wafer W passes through the plasma forming regions R2 to R4 by rotating the rotary table 12, active species of the $NH_3$ gas contained in the plasma are supplied to the wafer W and a thin film of SiN, which is a reaction product, is formed by reacting with the DCS gas adsorbed onto the wafer W. Even thereafter, the rotation of the rotary table 12 is continued, the movement of the wafer W to the adsorption region R1, the adsorption of the DCS gas onto the wafer W, the movement of the wafer W to the plasma forming regions R2 to R4, and the formation of the thin film of SiN on the previously formed SiN thin film by reaction of the adsorbed DCS gas with the active species of the $NH_3$ gas are repeatedly performed sequentially. That is, the SiN thin film is repeatedly laminated on the surface of the wafer W by repeatedly performing a cycle including the adsorption of the DCS gas and the reaction of the adsorbed DCS gas and the active species of the $NH_3$ gas, whereby the thickness of the SiN film is increased.

Figure 6:
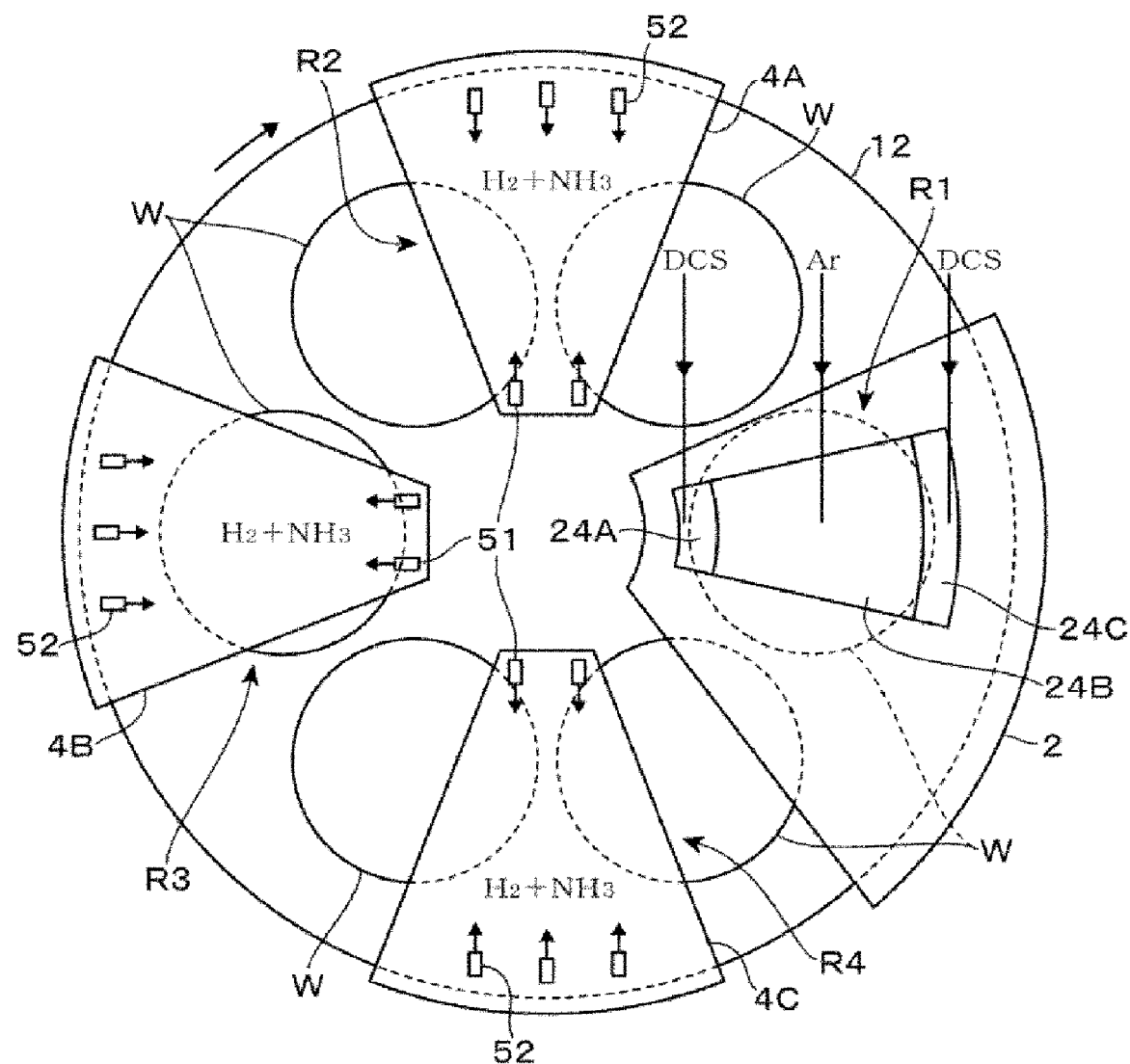
FIG. 6 is a plan view illustrating a gas supply state in the film forming apparatus.

Subsequently, after the rotary table 12 rotates a predetermined number of times from the formation of plasma and the start of supply of the DCS gas from the gas shower head 2, the discharge of the DCS gas from the gas discharge port 21 in the section 24B of the gas shower head 2 is stopped and the discharge of the Ar gas from the gas discharge port 21 of the section 24B is started (FIG. 6). That is, for the DCS gas, a pattern of combination of the flow rates of gases respectively discharged from the sections 24A, 24B, and 24C is changed. Furthermore, the DCS gas is continuously supplied to each of the gas discharge ports 21 of the sections 24A and 24C, at the same flow rate as before the start of the discharge of the Ar gas from, for example, the gas discharge port 21 of the section 24B. Thus, in the wafer W, a cycle including the adsorption of the DCS gas due to be located in the adsorption region R1 and the reaction by the active species due to be located in the plasma forming regions R2 to R4, is continuously performed.

Figure 7:
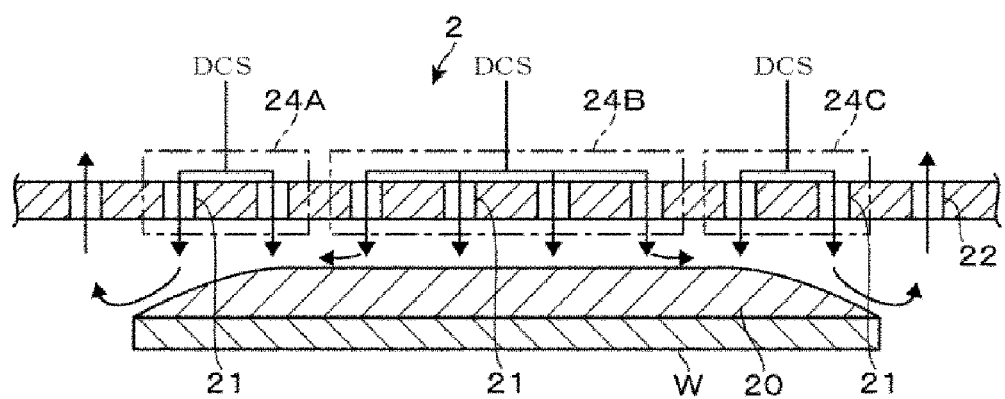
FIG. 7 is a longitudinal sectional side view of a wafer and a gas shower head.

The reason why the processing is performed in this manner will be described with reference to longitudinal sectional side views of the wafer W and the gas shower head 2 in FIGS. 7 to 9. More specifically, the longitudinal sectional sides of the wafer W illustrated in FIGS. 7 to 9 indicate cross sections when viewed taken along the diameter of the rotary table 12 and toward the cutting surface along the diameter of the wafer W. Thereafter, unless otherwise specified, both end portions of the wafer W are end portions of the wafer W on the central part side and the peripheral portion side of the rotary table 12, and the central part of the wafer W is between these end portions, i.e., the central part of the wafer W when viewed along the diameter of the rotary table 12. For convenience of explanation, the cycle performed before changing the pattern of combination of flow rates of the DCS gas as described above is set as a first cycle, and the cycle performed after the change is set as a second cycle. The arrows in FIGS. 7 and 8 indicate the flows of the gas discharged from the gas shower head 2.

During the execution of the first cycle, since the DCS gas is discharged from the gas discharge ports 21 of the sections 24A to 24C and supplied to the entire adsorption region R1, the DCS gas is adsorbed onto the entire surface of the wafer W passing through the adsorption region R1. Thus, the SiN film 20 is formed on the entire surface of the wafer W. However, when viewed along the radial direction of the rotary table 12, as going towards both end portions of the adsorption region R1, a position of the adsorption region R1 becomes closer to a position of the exhaust port 22, and thus the concentration of the DCS gas is lower. Thus, when the wafer W is located in the adsorption region R1, the concentration of the DCS gas at both end portions of the wafer W is lower than that at the central part of the wafer W. Therefore, as described in the section of the problem to be solved by the disclosure, the thickness of the SiN film 20 formed at both end portions of the wafer W at the end of the first cycle is smaller than that of the SiN film formed at the central part of the wafer W (see FIG. 7).

On the other hand, during the performance of the second cycle, since the DCS gas is discharged only from the gas discharge ports 21 of the sections 24A and 24C, the concentration of the DCS gas at both end portions of the adsorption region R1 when viewed along the radial direction of the rotary table 12 is higher than the concentration of the DCS gas at the central part. Furthermore, the Ar gas is discharged from the gas discharge port 21 of the section 24B, and after being supplied to the rotary table 12, the Ar gas diffuses on the rotary table 12 toward the lower side of the exhaust port 22. Thus, the DCS gas discharged from the gas discharge ports 21 of the sections 24A and 24C is prevented from flowing below the section 24B by the Ar gas and flows toward both end portions of the adsorption region R1, and as a result, the concentration of the DCS gas at both end portions is more likely to increase. In the state where the DCS gas is supplied to the adsorption region R1 in this way, the wafer W is located in the adsorption region R1, whereby the DCS gas is locally adsorbed onto both end portions of the wafer W.

Figure 8:
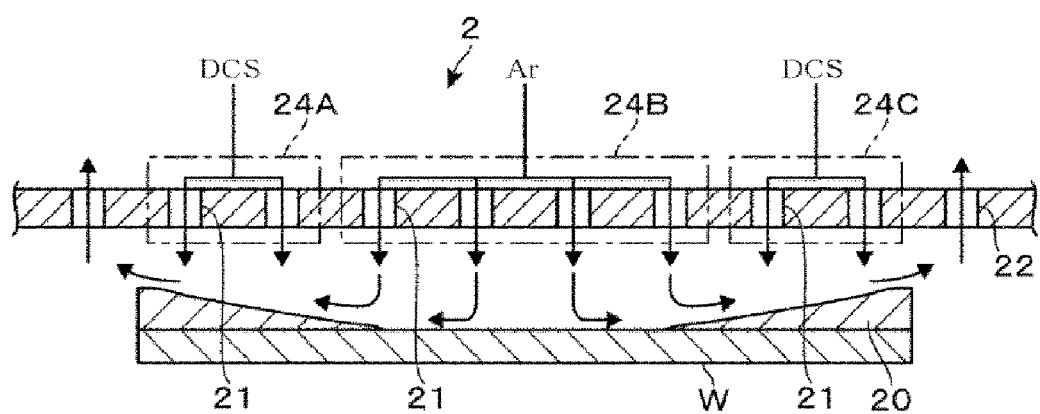
FIG. 8 is a longitudinal sectional side view of a wafer and a gas shower head.
Figure 9:
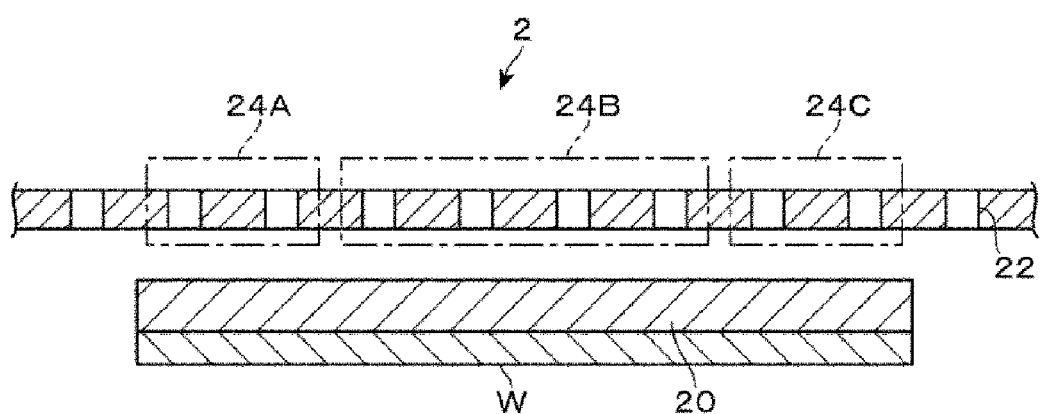
FIG. 9 is a longitudinal sectional side view of a wafer and a gas shower head.

Thus, if it is assumed that the first cycle is not performed and only the second cycle is performed, the SiN film 20 is formed only at both end portions of the wafer W as illustrated in FIG. 8. Since the second cycle is actually performed after the first cycle as described above, by performing the second cycle, it is possible to increase the film thickness at both end portions of the wafer W so as to eliminate variations in the film thickness in the plane of the wafer W of the SiN film 20 formed in the first cycle.

When the second cycle is performed a predetermined number of times, namely when the rotary table 12 rotates a predetermined number of times after the gas discharged from the gas discharge port 21 of the section 24B is switched, the supply of each gas and the supply of microwave are stopped in the plasma forming units 4A to 4C and the discharge of the DCS gas from the sections 24A and 24C, the discharge of the Ar gas from the section 24B, the discharge of the purge gas from the purge gas discharge port 23, and the exhaust from the exhaust port 22 are respectively stopped in the gas shower head 2. As described above, the thickness of the SiN film 20 at both end portions is increased by the second cycle, so that the thickness of the SiN film 20 between both end portions and the central part of the wafer W is in a state in which it is uniformed, as illustrated in FIG. 9. Thereafter, the wafer W is unloaded from the film forming apparatus 1 by a transfer mechanism (not shown).

As described above, in the film forming apparatus 1, in the first cycle, the DCS gas is discharged from each of the gas discharge ports 21 of the sections 24A, 24B, and 24C installed from the central side to the peripheral side of the rotary table 12 in the gas shower head 2, and in the second cycle, the DCS gas is discharged from the gas discharge ports 21 of the sections 24A and 24C and the Ar gas is discharged from the gas discharge port 21 of the section 24B. Accordingly, it is possible to suppress the thickness of the SiN film at both end portions of the wafer W from being smaller than the thickness of the SiN film at the central part of the wafer W, thereby the uniformity of film thickness in the plane of the wafer W may be improved.

Meanwhile, in the first cycle, for the SiN film formed on the wafer W, the pattern (first pattern) of the flow rate of the DCS gas discharged from each of the gas discharge ports 21 of the section 24A, the section 24B, and the section 24C where the film thickness at the central part becomes larger than the film thickness at both end portions is set. As described above, the second cycle is a cycle performed for correcting, i.e., alleviating the deviation of the film thickness formed between both end portions and the central part of the wafer W in the first cycle. Therefore, the pattern (second pattern) of the flow rate of the DCS gas discharged from each of the gas discharge ports 21 of the section 24A, the section 24B, and the section 24C may be set such that the film thickness at both end portions of the SiN film formed on the wafer W is larger than the film thickness of the central part. Furthermore, each of the gas discharge ports 21 of the section 24A and the section 24C forms one discharge port corresponding to both end portions of the wafer W which is the first region, and each of the gas discharge ports 21 of the section 24B forms another discharge port corresponding to the central part of the wafer W which is the second region.

Specifically, when in the first cycle, the DCS gas is discharged at A1 mL/min, B1 mL/min, and C1 mL/min from each of the gas discharge ports 21 of the sections 24A, 24B, and 24C and in the second cycle, the DCS gas is discharged at A2 mL/min, B2 mL/min, and C2 mL/min from each of the gas discharge ports 21 of the sections 24A, 24B, and 24, it may be sufficient that B1/A1>B2/A2 and B1/C1>B2/C2. In other words, in the processing example described above, B2 is set to 0, but it is not limited to 0, and for example, a mixture gas of the Ar gas and the DCS gas may be discharged at a flow rate which is smaller than A2 and C2 and larger than 0 from the section 24B in the second cycle.

In the second cycle, it is not necessary to discharge the Ar gas from the section 24B, but in that case, the DCS gas discharged from the sections 24A and 24C diffuses below the section 24B. Therefore, in order to sufficiently increase the film thickness at both end portions of the wafer W, it is desirable to discharge the Ar gas. As a blocking gas for blocking the entry of the DCS gas below the section 24B in this manner, any gas other than Ar may be used as long as it does not affect the formation of the SiN film. For example, an inert gas such as a nitrogen ($N_2$) gas or a helium (He) gas may be used.

Each of the first cycle and the second cycle may be performed once or more. Therefore, for example, the first cycle may be executed after executing the second cycle, or the first cycle may be performed again after execution in the order of the first cycle and the second cycle. In addition, after performing the first cycle and the second cycle, a third cycle with a pattern of combination of the flow rates of the DCS gas discharged from each of the gas discharge ports 21 of the sections 24A to 24C which is set to be different from the patterns in the first cycle and the second cycle, may be performed.

Furthermore, an opposing part for discharging the DCS gas facing the rotary table 12 may have a configuration in which it has a bar shape extending from the central part side of the rotary table toward the peripheral portion side, and multiple gas discharge ports are opened along its longitudinal direction. In addition, the shapes of the sections 24A to 24C of the gas shower head 2 are not limited to the aforementioned examples and may be, for example, rectangular shapes. The exhaust port 22 and the purge gas discharge port 23 of the gas shower head 2 may be installed so as to separate the atmosphere of the adsorption region R1 and the atmospheres of the plasma forming regions R2 to R4, and for example, the exhaust port 22 may be annularly installed so as to surround the purge gas discharge port 23 on an outer side of the purge gas discharge port 23, instead of the aforementioned layout. In the gas shower head 2, the Ar gas and the DCS gas are switched and discharged from the gas discharge port 21 of the section 24B, but a dedicated discharge port for the Ar gas may also be installed in the section 24B, and the Ar gas may be discharged from the dedicated discharge port.

Furthermore, for example, the flow rates of gases discharged from, for example, the sections 24B and 24C, among the section 24A, the section 24B, and the section 24C of the gas shower head 2, may be the same in the first cycle which is the cycle with the first pattern, and the second cycle which is the cycle with the second pattern, and the flow rate of the gas discharged from the section 24A may be different in the first cycle and the second cycle. For example, the flow rates of gases discharged from the sections 24A and 24B may also be the same in the first cycle and the second cycle and the flow rate of the gas discharged from the section 24C may be different in the first cycle and the second cycle. That is, in the gas shower head 2, only two sections are installed in which the gas is discharged to different positions in the radial direction of the rotary table 12 and the flow rate of the discharged gas can be adjusted, and the processing may be performed such that the combination of the flow rates of gases discharged from the respective sections in the first cycle and the combination of the flow rates of gases discharged from the respective sections in the second cycle are different from each other.

Furthermore, the film formed on the wafer W is not limited to the SiN film. For example, an oxidizing gas such as oxygen or ozone is discharged from the gas discharge ports 51 and 52 of the plasma forming units 4A to 4C, and the DCS gas adsorbed onto the wafer W may be oxidized to form a silicon oxide ($SiO_2$) film. In the plasma forming units 4A to 4C, film formation may also be performed by ALD by performing nitridation or oxidation treatment without forming plasma. Furthermore, the present disclosure is not limited to the aforementioned embodiments and the aforementioned embodiments may be appropriately modified or combined.

[Evaluation Tests]

Hereinafter, evaluation tests conducted according to the present disclosure will be described.

Evaluation Test 1

In evaluation test 1, a film thickness equivalent value of an SiN film at each position on the diameter of a wafer W along the diameter of the rotary table 12 when a film is formed by the film forming apparatus 1 was calculated by simulation. This film thickness equivalent value denotes a concentration of DCS gas×contact time of DCS gas [kmol·sec/$m^3$] and is calculated by the following equation 1, and the film thickness increases as the film thickness equivalent value increases.

The concentration of DCS gas×contact time of DCS gas (film thickness equivalent value) [kmol·sec/$m^3$]=∫ concentration [kmol/$m^3$]×angle between measurement points [rad]/angular velocity of rotary table 12 [rad/sec]  (Equation 1)

Figure 10:
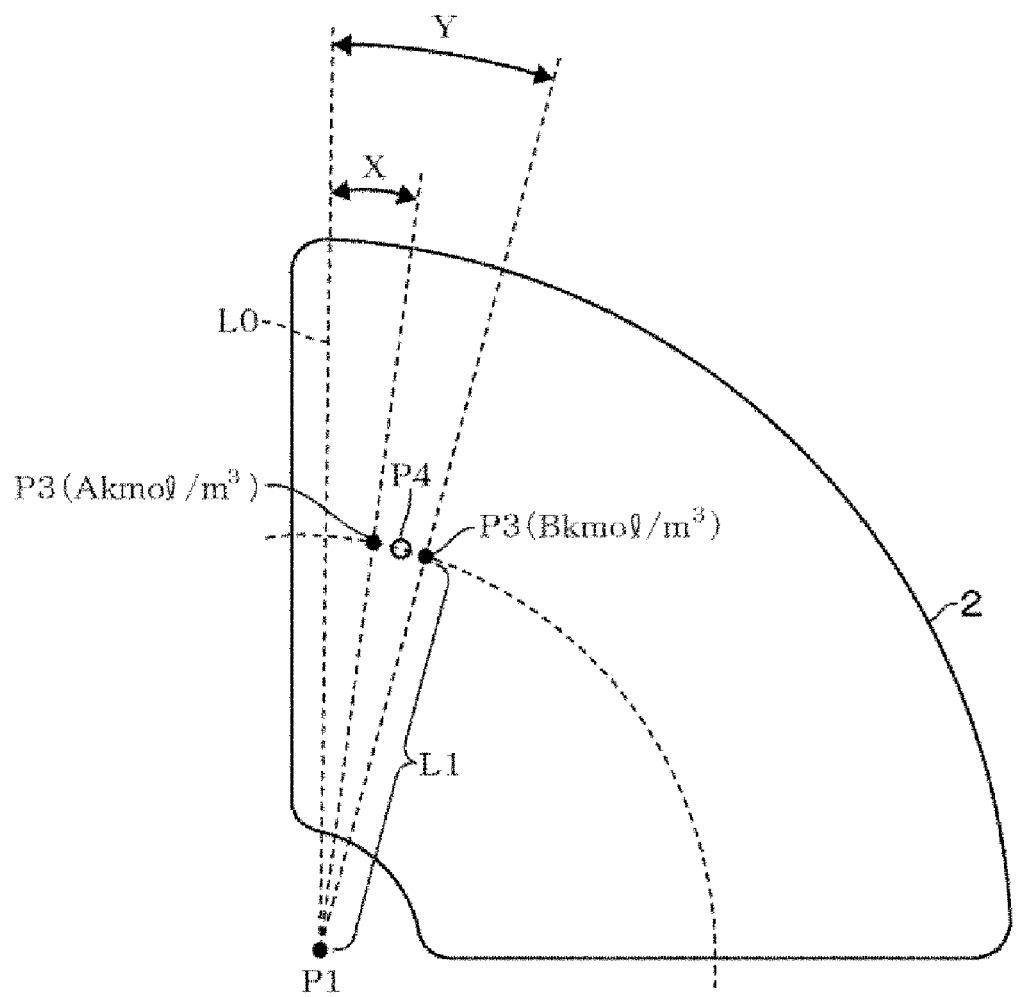
FIG. 10 is a plan view of the gas shower head.

The right side of equation 1 shown above will be described with reference to FIG. 10 which is a plan view of the gas shower head 2. In this simulation, a plurality of measurement points for the concentration of the DCS gas are set below the gas shower head 2 at each position along the radial direction of the rotary table 12 and at each position along the rotational direction of the rotary table 12. In FIG. 10, among the plurality of measurement points thus set, the measurement points (P2, P3), at which the distances from the central point P1 on the central axis P0 of the rotary table 12 are L1 which is the same and which are adjacent to each other in the rotational direction, are indicated. In the drawing, reference symbol L0 denotes a reference line which extends along the diameter of the rotary table 12 and passes through the central point P1 of the rotary table 12. Reference symbol X [rad] denotes an angle between the line connecting the measurement point P2 and the central point P1 of the rotary table 12 and the reference line L0, and reference symbol Y [rad] denotes an angle between the line connecting the measurement point P3 and the central point P1 of the rotary table 12 and the reference line L0. Assume that the concentrations of the DCS gas at the measurement points (P2, P3) are respectively A [kmol/$m^3$] and B [kmol/$m^3$], and the angular velocity of the rotary table 12 is ω [rad/sec].

At this time, a point located at the center between the measurement points P2 and P3 along the rotational direction of the rotary table 12 is assumed as an intermediate point P4, and the film thickness equivalent value [kmol·sec/$m^3$] at the intermediate point P4 is calculated as (A+B)/2[kmol/$m^3$]× (Y−X)[rad]/ω[rad/sec]. Similarly, from the measurement point at which the distance from the central point P1 other than the measurement points P2 and P3 (not shown) is L1, the film thickness equivalent value at the midpoint between the measurement points adjacent in the rotational direction is calculated. A sum of the values thus calculated is the right side of equation 1 and becomes the film thickness equivalent value at the position corresponding to the distance L1 in the diameter of the wafer W.

The processing conditions set in evaluation test 1 are listed below. The flow rates of the DCS gas supplied to the gas flow paths 25A, 25B, and 25C are respectively 200 sccm, 0 sccm, and 600 sccm, and the Ar gas is supplied to the gas flow path 25B wherein the flow rate thereof is 800 sccm. In addition, the section 24A and the section 24C are set in a circular arc shape along the rotational direction of the rotary table 12 wherein the width thereof is 8 mm. The flow rate of the exhaust gas from the exhaust port 22 is 1,800 sccm and the pressure at the exhaust port 22 is −42.4 Pa. The flow rate of the purge gas discharged from the purge gas discharge port 23 is 2,000 sccm, the height of the gap between the lower surface of the gas shower head 2 and the upper surface of the rotary table 12 is 2.3 mm, the internal pressure of the vacuum container 11 is 2.0 Torr (266.6 Pa), the internal temperature of the vacuum container 11 is 495 degrees C., and the number of rotations of the rotary table 12 is 10 rpm.

Furthermore, comparative test 1 was performed in which some of the processing conditions set in evaluation test 1 were modified and the processing was performed to calculate a film thickness equivalent value at each position on the diameter of the wafer W. In the gas shower head 2 of this comparative test 1, it is configured such that the gas flow paths 25A, 25B, and 25C which are partitioned from each other are not installed, and a gas flow path common to all the gas discharge ports 21 is installed in the gas shower head 2. That is, the downstream end of this common gas flow path is branched to form all the gas discharge ports 21. The flow rate of the DCS gas supplied to this common gas flow path was set to 800 sccm, the exhaust amount at the exhaust port 22 was set to 1,400 sccm, and the pressure at the exhaust port 22 was set to −41.1 Pa. Other processing conditions may be similar to the processing conditions set in evaluation test 1.

Figure 11:
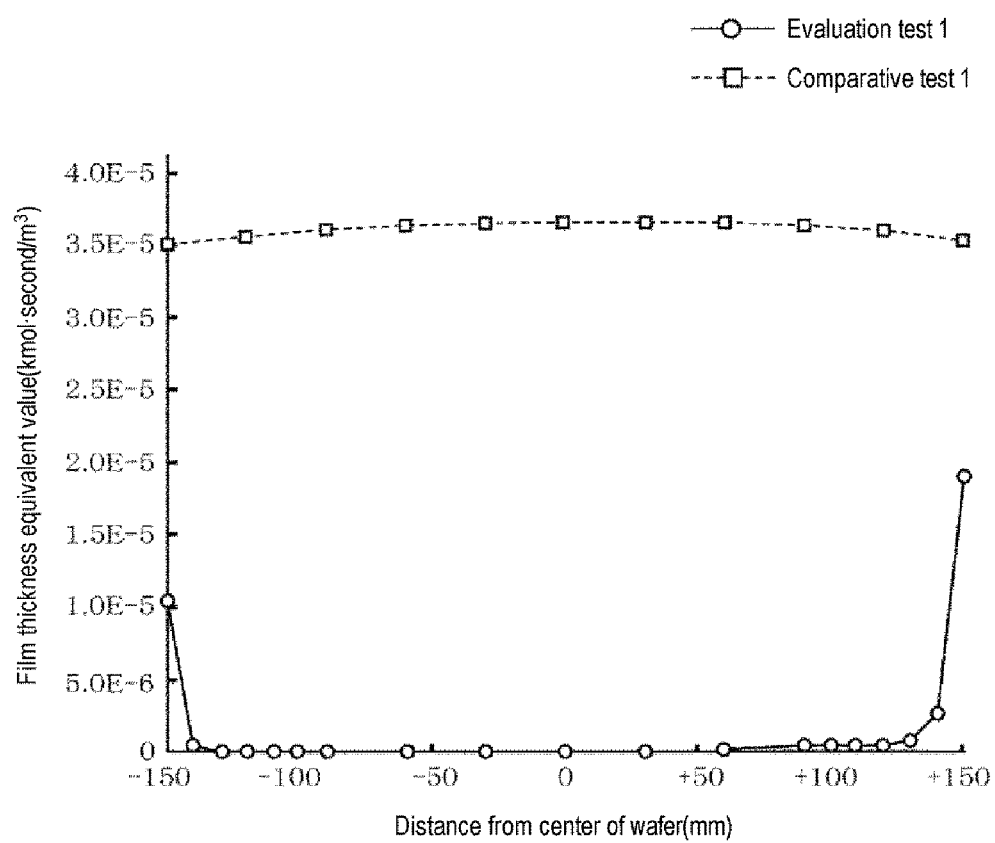
FIG. 11 is a graph showing results of an evaluation test.

The graph of FIG. 11 shows results of evaluation test 1 and comparative test 1. The vertical axis in the graph indicates the film thickness equivalent value [kmol·sec/m$^3$] of equation 1 shown above. The horizontal axis in the graph shows each position on the diameter of the wafer W for which the film thickness equivalent value has been calculated as a distance (unit: mm) from the center of the wafer W. For the sake of convenience, the position on one end side is defined as a distance given a positive sign and the position on the other end side is defined as a distance given a negative sign. As shown in the graph, in comparative test 1, the deviation of the film thickness equivalent value at each position of the wafer W is small, and the film thickness equivalent value at both end portions of the wafer W is slightly smaller than that at the central part of the wafer W. However, in evaluation test 1, when the distance from the center of the wafer W is 130 mm or less, the film thickness equivalent value is approximately 0, and when the distance from the center of the wafer W exceeds 130 mm, the film thickness equivalent value abruptly increases. That is, in evaluation test 1, it was confirmed that film formation was locally performed at both end portions of the wafer W to form a film having a film thickness distribution different from that of comparative test 1. From such results of evaluation test 1, it is considered that by performing the second cycle as described in the embodiment of the disclosure, it is possible to correct the film thickness of the wafer W having both end portions formed in the first cycle smaller than the central part.

Evaluation Test 2

In evaluation test 2, the processing was performed by rotating the rotary table 12 15 times under the same processing conditions as those of comparative test 1 described above, and then the processing was performed by rotating the rotary table 12 once under the same processing conditions as those of evaluation test 1 described above to calculate a film thickness equivalent value [kmol·sec/m$^3$] at each position of the wafer W in the same manner as in evaluation test 1. In addition, in comparative test 2, the same processing as in evaluation test 2 was performed except that the processing under the same processing conditions as those of evaluation test 1 was not performed, to measure a film thickness equivalent value [kmol·sec/m$^3$] in the same manner as in evaluation test 2.

Figure 12:
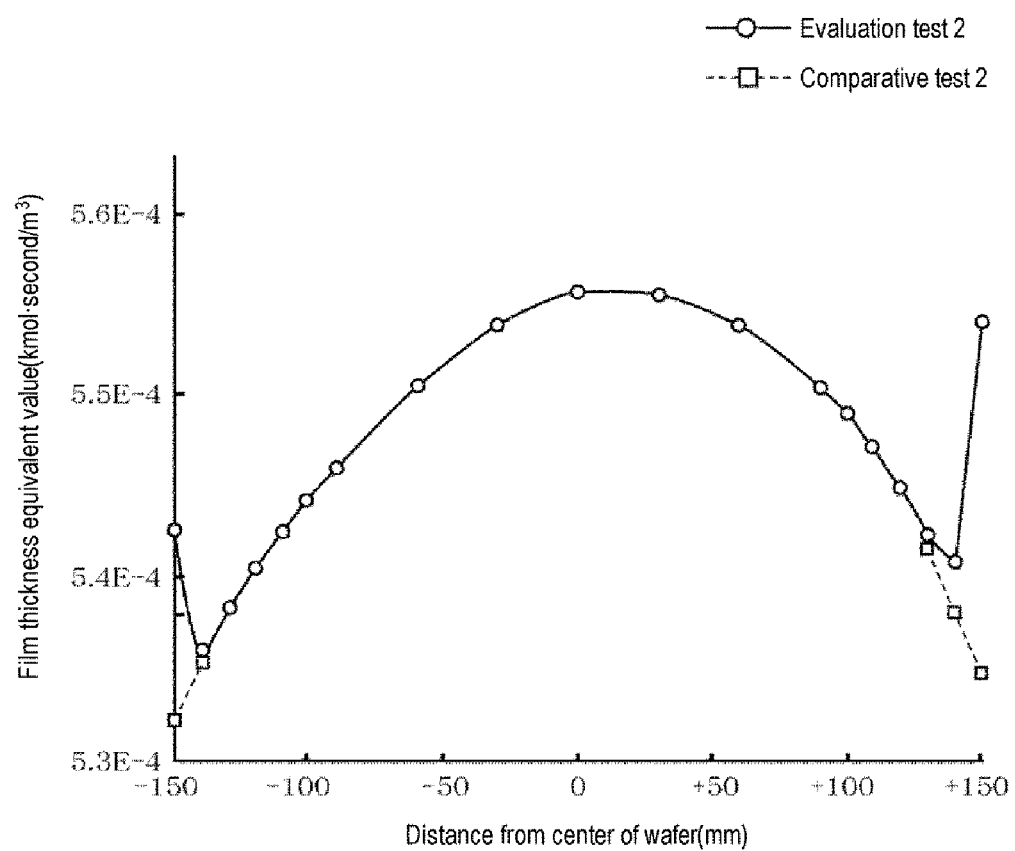
FIG. 12 is a graph showing results of an evaluation test.

The graph of FIG. 12 shows results of evaluation test 2 and comparative test 2, in which the vertical axis and the horizontal axis in the graph indicates a film thickness equivalent value [kmol·sec/m$^3$] and a position on the diameter of the wafer W, respectively, as in those of the graph of FIG. 11. In the graph, the result of evaluation test 2 is represented by circular plot, and the result of comparative test 2 is represented by square plot. Furthermore, in evaluation test 2 and comparative test 2, the film thickness equivalent values at the same position are calculated, but the calculated values at the same position are equal between evaluation test 2 and comparative test 2, and when the plot of evaluation test 2 and the plot of comparative test 1 overlap, only the plot of evaluation test 2 is indicated in the graph.

As shown in the graph, in comparative test 2, the film thickness equivalent value is the largest near the central part of the wafer W, the film thickness equivalent value decreases toward both end portions of the wafer W, and as a result, the film thickness equivalent value at both end portions of the wafer W is the smallest. In evaluation test 2, the film thickness equivalent value is the largest near the central part of the wafer W and the film thickness equivalent value decreases toward both end portions of the wafer W, but the film thickness equivalent values at both end portions of the wafer W are larger than the film thickness equivalent values near them.

In addition, in evaluation test 2 and comparative test 2, (maximum value−minimum value)/(average value×2)×100 (±%) was calculated for the film thickness equivalent value as 1.80% in evaluation test 2 and 2.26% in comparative test 2. Therefore, it was confirmed that the uniformity of the film thickness was higher in evaluation test 2 than in comparative test 2. As described above, from evaluation test 2, the effect of the disclosure was confirmed that, by performing the second cycle described in the embodiment of the disclosure, it is possible to increase the film thickness at both end portions of the wafer W and to increase the uniformity of the film thickness accordingly.

According to the present disclosure in some embodiments, the pattern of combination of the flow rates of the raw material gas respectively discharged from a plurality of discharge ports is different between one cycle and another cycle, in repeatedly performing a plurality of times, and the cycle comprises passing the substrate through an adsorption region formed by respectively discharging a raw material gas to different positions in a radial direction of a rotary table by rotating a substrate loaded on the rotary table and a reaction region to which a reaction gas is supplied. Thus, since the uniformity of adsorption amount of the raw material gas can be improved in a plane of the substrate, it is possible to improve the uniformity of film thickness in the plane of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method, comprising:
    loading a substrate on a rotary table installed in a vacuum container to rotate the substrate;
    forming an adsorption region for adsorbing a raw material gas to the substrate along a radial direction of the rotary table by discharging the raw material gas to different positions in the radial direction of the rotary table, respectively, from multiple discharge ports formed in an opposing part that is installed to face the rotary table;
    forming a reaction region, to which a reaction gas that reacts with the raw material gas to generate a reaction product is supplied, at a position spaced from the adsorption region in a rotational direction of the rotary table;
    separating an atmosphere of the adsorption region and an atmosphere of the reaction region by exhausting along a periphery of the adsorption region and by supplying a purge gas along the periphery of the adsorption region;
    forming a film by performing a cycle a plurality of times to deposit the reaction product on the substrate, the cycle comprising passing the substrate through the adsorption region and then the reaction region; and
    setting a combination of flow rates of the raw material gas, which are discharged from the multiple discharge ports, respectively, for a first pattern in order to perform the cycle with the first pattern and for a second pattern in order to perform the cycle with the second pattern, the second pattern being different from the first pattern,
    wherein, in order to alleviate a deviation between a film thickness of a first region and a film thickness of a second region in a plane of the substrate by the cycle performed with the first pattern, the second pattern is a pattern in which flow rates of the raw material gas discharged from one discharge port and another discharge port, which correspond to the first region and the second region, respectively, among the multiple discharge ports, are different from each other.

2. The method of claim 1, wherein the second pattern is a pattern for stopping the discharge of the raw material gas from the another discharge port.

3. The method of claim 1, further comprising discharging an inflow preventing gas, which is different from the raw material gas, from the opposing part so that, when performing the cycle with the second pattern, the raw material gas, which is discharged from the one discharge port, is prevented from flowing in a region on the rotary table where the raw material gas is discharged from the another discharge port when performing the cycle with the first pattern.

4. The method of claim 3, wherein the inflow preventing gas is discharged from the another discharge port.

5. The method of claim 1, wherein a first position, a second position, and a third position are sequentially set from a central side toward a peripheral edge side in the radial direction of the rotary table,
    wherein a discharge port of the multiple discharge ports for discharging the raw material gas to the first position is set as a first discharge port, a discharge port of the multiple discharge ports for discharging the raw material gas to the second position is set as a second discharge port, and a discharge port of the multiple discharge ports for discharging the raw material gas to the third position is set as a third discharge port, and
    wherein the one discharge port is the first discharge port or the third discharge port, and the another discharge port is the second discharge port.

6. A non-transitory computer-readable storage medium storing a computer program used in a film forming apparatus for forming a film on a substrate loaded on a rotary table,
    wherein the computer program has steps organized to execute the film forming method of claim 1.

* * * * *